(12) United States Patent
Hartmann et al.

(10) Patent No.: US 10,224,424 B2
(45) Date of Patent: Mar. 5, 2019

(54) SEMICONDUCTOR MODULE WITH TWO AUXILIARY EMITTER CONDUCTOR PATHS

(71) Applicant: ABB Schweiz AG, Baden (CH)

(72) Inventors: Samuel Hartmann, Staufen (CH); Didier Cottet, Zürich (CH); Slavo Kicin, Zürich (CH)

(73) Assignee: ABB Schweiz AG, Baden (CH)

( * ) Notice: Subject to any disclaimer, the term of this patent is extended or adjusted under 35 U.S.C. 154(b) by 372 days.

(21) Appl. No.: 15/237,058

(22) Filed: Aug. 15, 2016

(65) Prior Publication Data

US 2016/0351697 A1 Dec. 1, 2016

Related U.S. Application Data

(63) Continuation of application No. PCT/EP2015/050611, filed on Jan. 14, 2015.

(30) Foreign Application Priority Data

Feb. 14, 2014 (EP) ..................................... 14155208

(51) Int. Cl.
*H01L 29/739* (2006.01)
*H01L 23/64* (2006.01)
(Continued)

(52) U.S. Cl.
CPC .......... *H01L 29/7393* (2013.01); *H01L 23/02* (2013.01); *H01L 23/645* (2013.01);
(Continued)

(58) Field of Classification Search
CPC .......... H03K 17/08116; H03K 17/127; H03K 17/0424; H03K 17/0828; H01L 23/02;
(Continued)

(56) References Cited

U.S. PATENT DOCUMENTS 5,034,343 A 7/1991 Rouse et al.
6,872,640 B1 3/2005 Mouli
(Continued)

FOREIGN PATENT DOCUMENTS

DE 10005754 A1 8/2001
EP 0455322 A1 11/1991
(Continued)

OTHER PUBLICATIONS

European Patent Office, International Search Report & Written Opinion issued in corresponding Application No. PCT/EP2015/070793, dated Nov. 23, 2015, 12 pp.
(Continued)

*Primary Examiner* — Thomas Skibinski
(74) *Attorney, Agent, or Firm* — J. Bruce Schelkopf; Taft Stettinius & Hollister LLP

(57) ABSTRACT

A semiconductor module comprises a semiconductor chip comprising a semiconductor switch having a collector, emitter and gate, a collector terminal connected to the collector, gate terminal connected to the gate, an emitter terminal connected to the emitter via an emitter conductor path having an emitter inductance, an auxiliary emitter terminal connected to the emitter, a first conductor path connected to the emitter, and a second conductor path connected to the emitter having a different mutually inductive coupling with the emitter conductor path as the first conductor path. The first conductor path and the second conductor path are connectable to the auxiliary emitter terminal and/or the first conductor path is connected to the auxiliary emitter terminal and the second conductor path is connected to a second auxiliary emitter terminal. The semiconductor switch is an IGBT and each of the first conductor path and the second conductor path comprises bridging points for connecting the respective conductor path to the auxiliary emitter terminal.

20 Claims, 3 Drawing Sheets

(51) Int. Cl.
*H01L 25/07* (2006.01)
*H03K 17/12* (2006.01)
*H01L 23/02* (2006.01)
*H01L 23/00* (2006.01)
*H01L 27/088* (2006.01)
*H01L 29/417* (2006.01)
*H01L 29/423* (2006.01)
*H03K 17/081* (2006.01)
*H03K 17/082* (2006.01)
*H03K 17/0424* (2006.01)
*H02M 1/088* (2006.01)

(52) U.S. Cl.
CPC ............ *H01L 24/48* (2013.01); *H01L 25/072* (2013.01); *H01L 27/088* (2013.01); *H01L 29/41708* (2013.01); *H01L 29/4232* (2013.01); *H03K 17/08116* (2013.01); *H03K 17/127* (2013.01); *H01L 2224/4813* (2013.01); *H01L 2924/0002* (2013.01); *H01L 2924/13055* (2013.01); *H02M 1/088* (2013.01); *H03K 17/0424* (2013.01); *H03K 17/0828* (2013.01)

(58) Field of Classification Search
CPC ............... H01L 23/645; H01L 29/7393; H01L 29/41708; H01L 29/4232
USPC ................ 327/108–112, 427, 434, 437, 525, 327/564–566; 326/82, 83, 87
See application file for complete search history.

(56) References Cited

U.S. PATENT DOCUMENTS

| | | | |
|---|---|---|---|
| 7,800,174 B2* | 9/2010 | Yamaguchi | H01L 23/49562 257/341 |
| 2002/0190325 A1* | 12/2002 | Mochizuki | H01L 23/62 257/356 |
| 2007/0264795 A1 | 11/2007 | Miller et al. | |
| 2013/0153958 A1* | 6/2013 | Kurachi | H01L 23/58 257/164 |
| 2013/0221403 A1 | 8/2013 | Lu | |
| 2015/0326222 A1* | 11/2015 | Niemi | H03K 17/687 327/427 |

FOREIGN PATENT DOCUMENTS

| | | |
|---|---|---|
| EP | 1065706 A2 | 1/2001 |
| EP | 2249392 A2 | 2/2010 |
| WO | 9423444 A2 | 10/1994 |

OTHER PUBLICATIONS

European Patent Office, Extended Search Report issued in corresponding Application No. 14155208.3, dated Jul. 25, 2014, 6 pp.

* cited by examiner

US 10,224,424 B2

SEMICONDUCTOR MODULE WITH TWO AUXILIARY EMITTER CONDUCTOR PATHS

FIELD OF THE INVENTION

The invention relates to the field of high power semiconductor. In particular, the invention relates to a semiconductor module and a semiconductor assembly.

BACKGROUND OF THE INVENTION

Semiconductor modules comprise one or more semiconductor chips, which each comprise one or more semiconductors like diodes, transistors, thyristors and the like. In such modules, high power semiconductor switches like IGBTs are used for switching currents of more than 10 A and/or more than 1000 V.

As a rule, switching losses should be kept at a minimum, which may be achieved by fast switching. On the other hand, fast switching may also cause electromagnetic interference problems. The switching speed is therefore often controlled via a gate resistor or via intelligent gate drives controlling the gate current $I_C$ (for example by using $I_C$ or dIc/dt feedback). However, gate resistors usually do not help in case of short circuits and intelligent gate drivers may be expensive and complex to implement and control.

In most IGBT modules, the common emitter impedance is carefully designed to be identical for all IGBTs (in case of paralleled IGBTs) and not too large or too small. Usually, the actual value is chosen by the module manufacturer and cannot be changed by the module user.

Some IGBT modules provide an auxiliary emitter terminal, which may be used for providing the voltage for the gate drive. In particular, high current IGBT modules usually need an auxiliary emitter. Otherwise switching would be too slow. The PCB design cannot compensate the coupling.

Other types of modules do not provide auxiliary emitter terminals at all, thus leaving the responsibility to the PCB and gate drive designer. As a rule, short circuit protection for modules with low dI/dt damping has to be applied with external circuits, typically adding extra losses and extra components.

In this technical field, generic semiconductor modules are know from US 2013/153958 A1 and DE 100 05 754 A1.

DESCRIPTION OF THE INVENTION

Fast switching IGBTs generate high dI/dt and dU/dt, which may be the sources of various electromagnetic interference problems inside and outside the semiconductor modules. This electromagnetic interference effect originate from the relations $U_{ind}=L*dI/dt$ and $I_{ind}=C*dI/dt$.

One important design parameter inside an IGBT module is the so-called common emitter stray inductance $L_{\sigma\_CE}$ between the main emitter terminal and the auxiliary emitter terminal used to connect the gate-emitter voltage to turn the device on and off. Considering the typically high turn-on/off collector currents (dI_c/dt), the voltage drop across that common emitter stray inductance $L_{\sigma\_CE}$ may become significant. Because of the induced voltage, the IGBT chip sees a different effective gate voltage $U_{G'E'}$ than the gate voltage applied at the module terminals $U_{GE}$.

The following formulas describe the relation between the induced $U_{GE}$ voltage across the common emitter stray inductance $L_{\sigma\_CE}$ and the effective gate voltage $U_{G'E'}$.

$$U_{G'E'} \sim U_{GE} - L_{\sigma\_CE}\frac{dI_C}{dt}, \frac{dI_C}{dt} \sim U_{G'E'}$$

In case of paralleled IGBTs, due to asymmetric module layouts, each IGBT may see a different $U_{GE}$ causing unbalanced dynamic current sharing. The advantages on the other hand are, as can be seen from above equations, that the effective gate voltage $U_{G'E'}$ is reduced when dI/dt is increasing, which acts as self-damping in case of high dI/dt thus providing effective built-in short circuit protection.

The objective of the invention is to provide an easy to control and easy to configure semiconductor module with built-in short-circuit protection.

This objective is achieved by the subject-matter of the independent claims. Further exemplary embodiments are evident from the dependent claims and the following description.

An aspect of the invention relates to a semiconductor module, in particular a high power semiconductor module. It has to be understood that high power may relate to currents above 10 A and/or above 1000 V. A module may be a component of a semiconductor device that is interchangeable as a whole, for example its members may be mechanically connected with each other via, for example, a common board or common housing.

According to an embodiment of the invention, the semiconductor module comprises at least one semiconductor chip comprising at least one semiconductor switch having a collector, emitter and gate, a collector terminal connected to the collector, a gate terminal connected to the gate, an emitter terminal connected to the emitter via an emitter conductor path having an emitter inductance and an auxiliary emitter terminal connected to the emitter.

In other words, the semiconductor module comprises a chip with a semiconductor switch and provides terminals for the collector, emitter and gate of the switch. Furthermore, the semiconductor module provides an auxiliary emitter terminal that may be used for providing the voltage that is used for switching the switch via the gate. Usually, a gate drive is connected between the gate terminal and the auxiliary emitter terminal.

Furthermore, the semiconductor module comprises a first conductor path connected to the emitter and a second conductor path connected to the emitter having a different mutually inductive coupling with the emitter conductor path as the first conductor path. It has to be understood that a conductor path may be any type conductor like a metal strip, a wire, or a strip line on a circuit board. The two conductor paths are used for providing different ways of connecting the gate terminal to the emitter. In particular, the different paths have different coupling to the emitter conductor path and therefore, by choosing to connect one or both of the conductor paths to the gate allows to control its switching characteristics using the above described effect.

According to an embodiment of the invention, the first conductor path and the second conductor path are connectable to the auxiliary emitter terminal. For example, the semiconductor module only has one auxiliary emitter terminal, but provides the possibility to connect the auxiliary emitter terminal via the first, the second or both conductor paths with the emitter. In this way, the semiconductor module may be configured to provide the desired coupling with the main emitter conductor path at one auxiliary emitter terminal.

The semiconductor module may provide two or more common emitter conductor paths, each one with different $U_{GE}$ coupling, and which may be selected by placing bond wires to the respective locations. With this method, the coupling usually cannot be changed after manufacturing, but the module user may choose the value out of a specific range and he gets the module delivered with the chosen value.

According to an embodiment of the invention, the first conductor path is connected to the auxiliary emitter terminal and the second conductor path is connected to a second auxiliary emitter terminal. The semiconductor module may provide two auxiliary emitter terminals, each of which is connected via another conductor path to the emitter. The gate drive may be connected to the first, the second or to both auxiliary emitter terminals for choosing the desired coupling for connecting the emitter with the gate.

According to an embodiment of the invention, the at least one semiconductor switch is a transistor such as an IGBT. However, in general, the semiconductor module may comprise semiconductor switches of other types, such as thyristors, for example IGCTs.

According to an embodiment of the invention, the first conductor path and/or the second conductor path is connected to the emitter conductor path such that the first conductor path and/or the second conductor path and the emitter inductance have a common part. In other words the respective conductor path and the emitter conductor path may have a common conductor. The first conductor path may be connected with one end to a first connection point to the emitter conductor path. Similarly, the second conductor path may be connected with one end to a second connection point to the emitter conductor path. The second connection point may be different from the first connection point.

According to an embodiment of the invention, the second conductor path has a mutually inductive coupling with the emitter conductor path that is at least twice as high as a mutually inductive coupling of the first conductor path with the emitter conductor path. The semiconductor module may provide two auxiliary emitter terminals, one with a (very) low coupling and one with a high coupling. The module user may choose between the two or use both, also in combination with a voltage dividing resistor, to set the desired damping. In general, the module supplier and/or module user gets the possibility to configure the amount of $U_{SE}$ coupling such as to adapt the self-damping to its application requirements.

According to an embodiment of the invention, each of the first conductor path and the second conductor path comprises bridging points for connecting the respective conductor path to the auxiliary emitter terminal. For example, both conductor paths may be designed with an interruption (providing bridging points at the end) that may be bypassed with a bond wire or other conductor. A bridging point therefore may be a land for connecting a conductor. The bond wire or other conductor connecting the desired conductor path to the auxiliary emitter terminal may already be placed by the module manufacture. However, it may be possible that the bridging points are accessible after the manufacturing of the module (for example provided on a housing of the semiconductor module) and/or that the bond wire or other conductor connecting the desired conductor path to the auxiliary emitter terminal is placed by a module user.

It is possible, that the semiconductor module further comprises a third conductor path connected to the emitter having a mutually inductive coupling with the emitter conductor path different from the mutually inductive coupling of the first conductor path and the second conductor path with the emitter conductor path. Also the third conductor path may be connected to the auxiliary emitter terminal via bridging points as described with respect to the first and second conductor paths.

The third conductor path and the emitter conductor path have a common part. For example, the coupling of the third conductor path may be higher as the coupling of the first conductor path and/or may be lower as the coupling of the second conductor path.

The third conductor path is connected to the emitter conductor path at a third connection point between a first connection point of the first conductor path to the emitter conductor path and a second connection point of the second conductor path to the emitter conductor path. In other words, the third conductor path may branch from the emitter conductor path between the branching points (i.e. connection points) of the other two paths.

According to an embodiment of the invention, the first conductor path and/or second conductor path comprise an auxiliary inductance different from the emitter inductance. For example, an additional inductor may be provided in the semiconductor module that is connected in the respective conductor path.

According to an embodiment of the invention, wherein the first conductor path and/or second conductor is inductively coupled with the emitter inductance via an auxiliary inductance. For example, the two conductor paths may have sections that run parallel to each other, thereby providing the inductive coupling.

According to an embodiment of the invention, the semiconductor module comprises at least two semiconductor switches, which are connected in parallel via their emitters connected to the emitter terminal and which are connected in parallel via their gates, which are connected to the gate terminal. In such a way, the semiconductor module may process higher currents and may be controlled by only one gate unit.

According to an embodiment of the invention, a first semiconductor switch is connected via a first emitter conductor path having a first emitter inductance with the emitter terminal and a second semiconductor switch is connected via a second emitter conductor path having a second emitter inductance with the emitter terminal.

According to an embodiment of the invention, at least one of the first conductor path and the second conductor path comprises bridging points for interconnecting the first emitter conductor path and the second emitter conductor path. In such a way, the auxiliary emitter terminal may be connected to all emitter inductance paths, such that each emitter conductor path provides the same inductance to the respective emitter of the respective semiconductor switch.

According to an embodiment of the invention, the at least two semiconductor switches are connected with their emitters via a common emitter conductor path to the emitter terminal, the emitter conductor path having a common emitter inductance. It also may be the case that most of the emitter inductance is provided by a common conductor path interconnecting the emitters of the semiconductor switches at one end and being connected to the emitter terminal at the other end.

According to an embodiment of the invention, the at least one semiconductor chip, the emitter conductor path, the first conductor path and the second conductor path are assembled in a common housing. The collector terminal, the gate terminal, the emitter terminal and the auxiliary emitter terminal are provided on the common housing. Also the other components mentioned above, like the third conductor path, the common emitter conductance path, etc. may be assembled into the housing. Furthermore, also the second auxiliary emitter terminal may be provided on the common housing.

A further aspect of the invention relates to a semiconductor assembly comprising a semiconductor module as described above and in the following with a first auxiliary emitter terminal and a second auxiliary emitter terminal, and a gate drive interconnecting the gate terminal and the emitter via at least one of the first auxiliary emitter terminal, the first auxiliary emitter terminal and a first auxiliary resistor, the second auxiliary emitter terminal, and the second auxiliary emitter terminal and a second auxiliary resistor.

The gate drive may be connected to a semiconductor module with two auxiliary emitter terminals in different ways. For example, the gate drive may be connected to only one of the first or second auxiliary emitter terminal. Alternatively, it may be connected to both the first and second auxiliary emitter terminal, optionally via one or more auxiliary resistors that are connected between an auxiliary emitter terminal and the gate drive.

These and other aspects of the invention will be apparent from and elucidated with reference to the embodiments described hereinafter.

BRIEF DESCRIPTION OF THE DRAWINGS

The subject-matter of the invention will be explained in more detail in the following text with reference to exemplary embodiments which are illustrated in the attached drawings.

The reference symbols used in the drawings, and their meanings, are listed in summary form in the list of reference symbols. In principle, identical parts are provided with the same reference symbols in the figures.

DETAILED DESCRIPTION OF EXEMPLARY EMBODIMENTS

Figure 1:
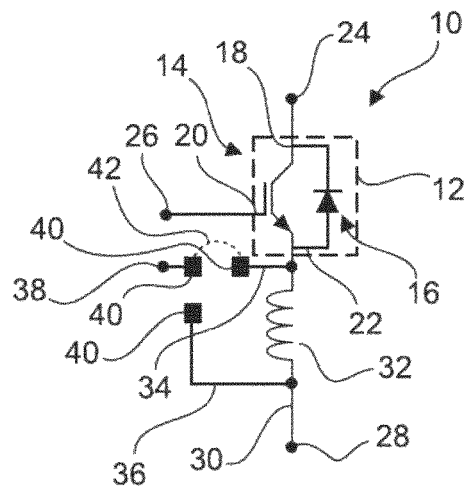
FIG. 1 schematically shows a semiconductor module according to an embodiment of the invention.

FIG. 1 shows a semiconductor module 10 comprising a single semiconductor chip 12 with a semiconductor switch 14 and a freewheeling diode 16 connected antiparallel to the semiconductor switch 14.

The semiconductor switch 14, which may be an IGBT as shown in the figures, comprises a collector 18, a gate 20 and an emitter 22. The collector 18 is connected to a collector terminal 24, the gate 20 to a gate terminal 26 and the emitter 22 to a (main) emitter terminal 28. The terminals 24, 26, 28 may be used to connect the semiconductor module 10 with further components of a semiconductor device.

The emitter terminal 28 is connected via a conductor path 30 with the emitter 22, which has an emitter inductance 32. For example, the emitter inductance 32 may have a value between 1 nH and 100 nH.

The semiconductor module 10 further comprises two further conductor paths 34, 36 that are connected with the emitter. The second conductor path 36 shares the emitter inductance 32 with the emitter conductance path 30.

The semiconductor module 10 comprises an auxiliary emitter terminal 38 that may be connected to one or both of the conductor paths 34, 36. The conductor paths 34, 36 comprise bridging points 40 that may short-circuited by a bond wire 42. In FIG. 1, the bond wire 42 interconnects the bridging points 40 of the first conductor path 34, such that the auxiliary emitter terminal is connected to the emitter 22 without the inductance 32.

With the bond wire 42, the semiconductor module 10 may be configured to be a fast or slow switching module. This setting may already be done during manufacturing.

Figure 2:
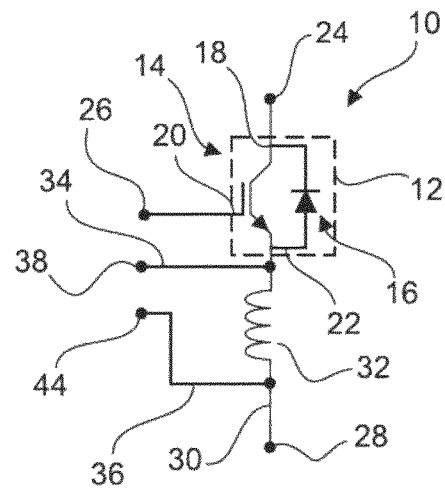
FIG. 2 schematically shows a semiconductor module according to a further embodiment of the invention.

FIG. 2 shows a semiconductor module 10 comprising a first auxiliary emitter terminal 38 and a second auxiliary emitter terminal 44. The first conductor path 34 is connected to the first auxiliary emitter terminal 38 and the second conductor path 36 is connected to the first auxiliary emitter terminal 44. In such a way, both conductor paths 34, 36 are available at separate auxiliary emitter terminals 38, 44. A module user may choose which terminal 38, 44 to use such as to set the switching speed himself.

Figure 3:
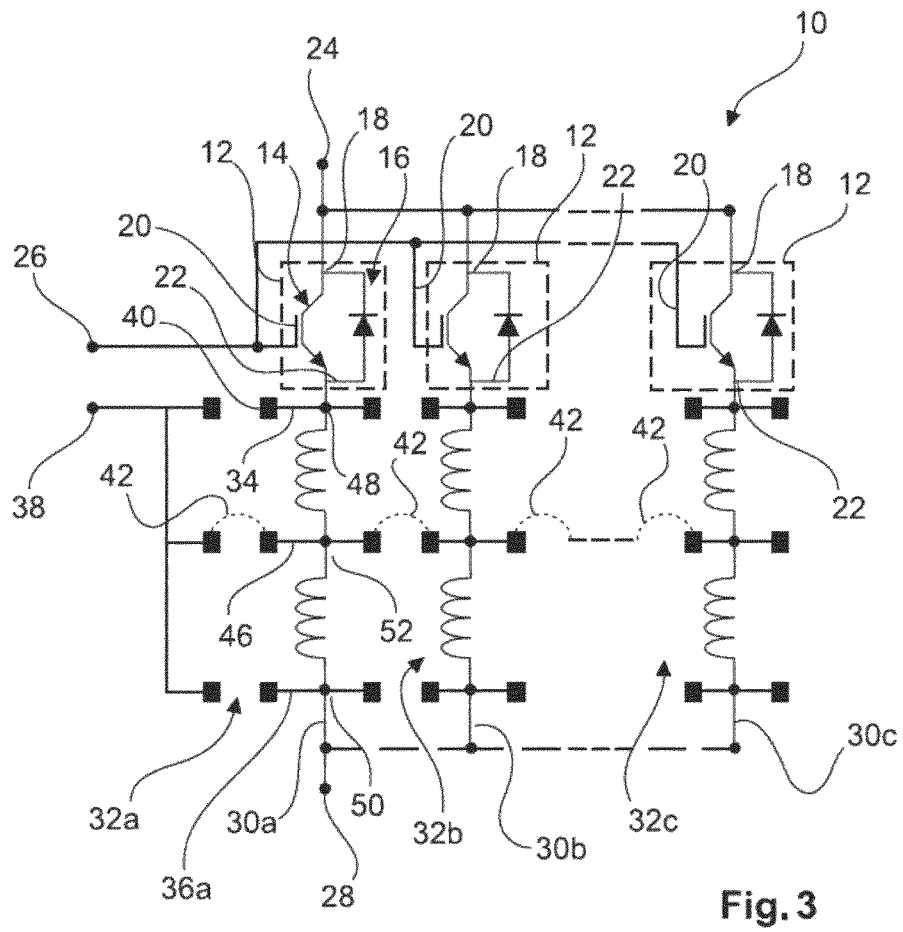
FIG. 3 schematically shows a semiconductor module according to a further embodiment of the invention.

FIG. 3 shows a semiconductor module 10 with paralleled chips 12. Each chip comprises a semiconductor switch 14 and an antiparallel connected freewheeling diode 16. The collectors 18 of all semiconductor switches 14 are connected to the collector terminal 24. The gates 20 of all semiconductor switches 14 are connected to the gate terminal 24. For each semiconductor switch 14 a separate emitter conductor path $30a$, $30b$, $30c$ is provided, which connects the respective emitter 22 with the emitter terminal 28.

The emitter conductor paths $30a$, $30b$, $30c$ comprise emitter inductances $32a$, $32b$, $32c$, which may have the same value.

Three different conductor paths 34, 36, 46 are provided in the semiconductor module 10. The first conductor path 34 is directly connected to the emitters 22 at connection points 48 and has bridging points 40 to interconnect all emitters 22 directly with the auxiliary emitter terminal 38. The second conductor path 36 is connected to connection points 50 between the emitter terminal 28 and the emitter inductances $32a$, $32b$, $32c$ and also has bridging points 40 to interconnect these points directly with the auxiliary emitter terminal 38. The third conductor path 46 is connected to connection points 52 in the emitter inductances $32a$, $32b$, $32c$ and also has bridging points 40 to interconnect these points directly with the auxiliary emitter terminal 38. For example, the connection points 52 may be chosen that the inductance of the third conductor path 46 is half of the value of the inductance of the second conductor path 36.

In the example shown in FIG. 3, the bridging points 40 of the third conductor path 46 are bridged/short-circuited with bond wires 42. By applying the bond wires 22, the switching speed of the semiconductor module 10 may be set during manufacturing.

Figure 4:
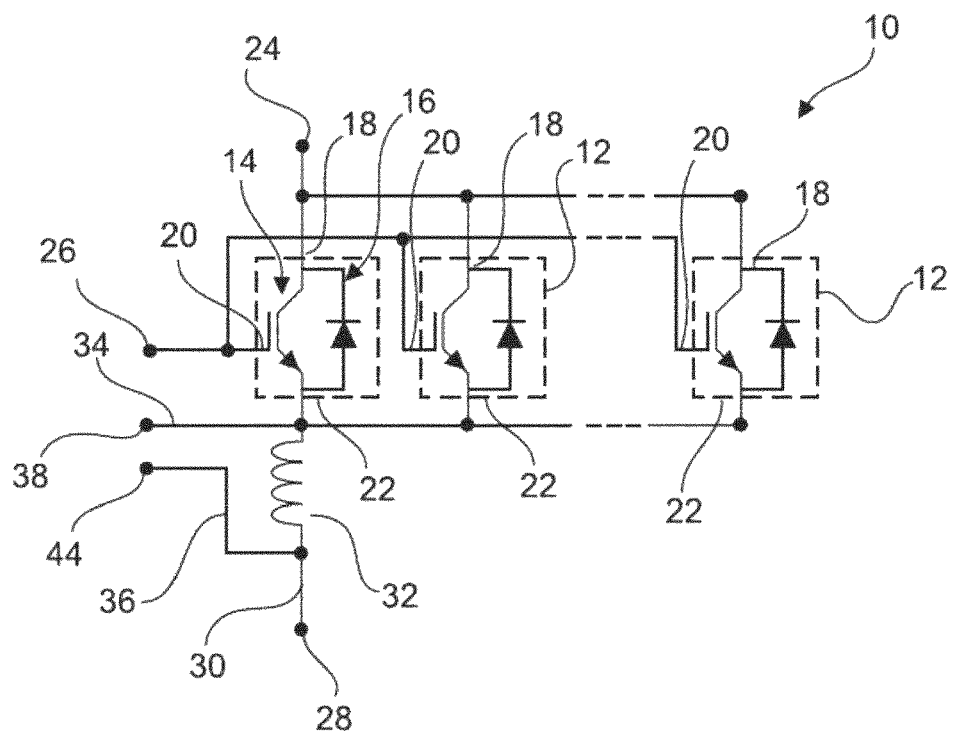
FIG. 4 schematically shows a semiconductor module according to a further embodiment of the invention.

FIG. 4 shows a semiconductor module 10 with paralleled chips 12 analogously to FIG. 3. The emitters 22 of the semiconductor switches are directly connected with each other and are connected via a common emitter conductance path 30 with the emitter terminal 28. Analogously to FIG. 2, the semiconductor module 10 has two auxiliary emitter terminals 38, 44, wherein the first auxiliary emitter terminal 38 is directly connected to the emitters 22 via the first conductor path 34 and the second auxiliary emitter terminal 44 is directly connected to the emitter terminal 28 via the common emitter conductor path 30.

Figure 5:
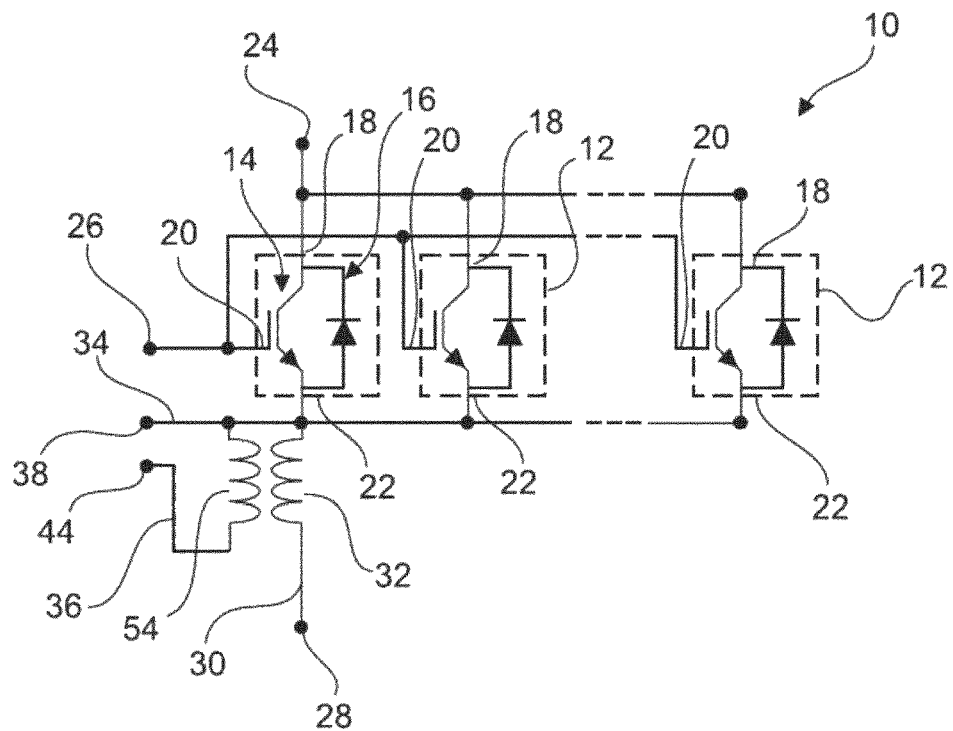
FIG. 5 schematically shows a semiconductor module according to a further embodiment of the invention.

FIG. 5 shows a semiconductor module 10 with paralleled chips 12 with a common emitter conductor path 30 analogously to FIG. 4. However, in FIG. 4, the second conductor path 36 is connected via an auxiliary inductance 54, which is inductively coupled to the emitter inductance 32. In this case, the high $U_{SE}$ coupling is not achieved via the common emitter conductor path 30, but instead with two coupled inductances 54, 32.

Figure 6:
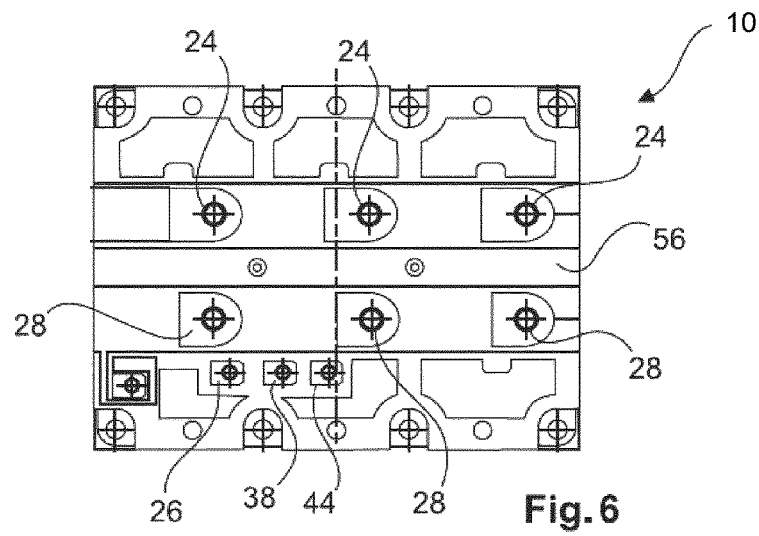
FIG. 6 shows a view from above onto a housing of a semiconductor module according to an embodiment of the invention.

FIG. 6 shows the housing 56 of a semiconductor module 10, for example for the modules 10 of FIG. 1 to FIG. 5. The chips 12, conductor paths 30, 34, 36, 46, inductances 32, 54 may be inside the housing 56. The terminals 24, 26, 28, 38, 44 may be provided on the housing 56. In FIG. 6, each of the terminals 24, 28 is provided with three contacts connected in parallel.

FIG. 7A to 7E show five different variants of a semiconductor assembly 58, in which the two auxiliary terminals 38, 44 are connected in different ways to a gate drive 60. With the variants, the amount of coupling and hence the switching speed of the semiconductor module 10 may be tuned. The first auxiliary emitter terminal 36 provides a lower inductance as the second auxiliary emitter terminal 44.

Figure 7A:
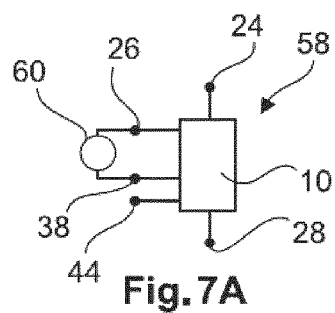
FIG. 7A to 7E schematically show semiconductor assemblies according to embodiments of the invention.

FIG. 7A shows the variant with fastest switching. The gate driver 60 is connected only to the first auxiliary terminal 36.

Figure 7D:
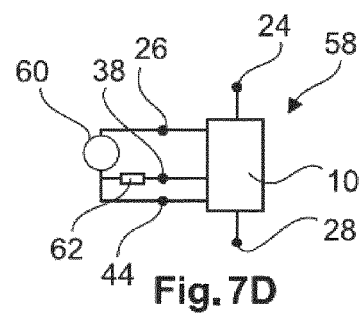
Figure 7B:
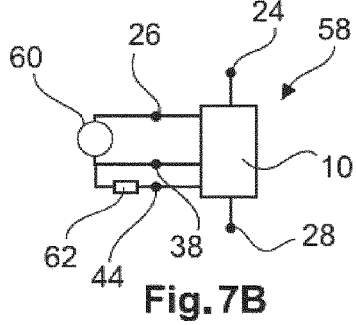

In FIG. 7B, the gate driver 60 is connected directly to the first auxiliary emitter terminal 36 and via an auxiliary resistor 62 to the second auxiliary emitter terminal 44.

Figure 7E:
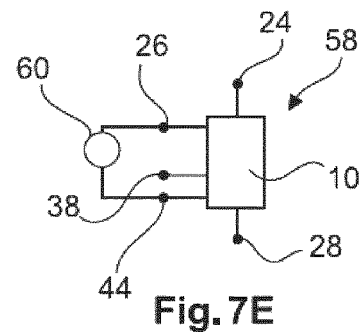
Figure 7C:
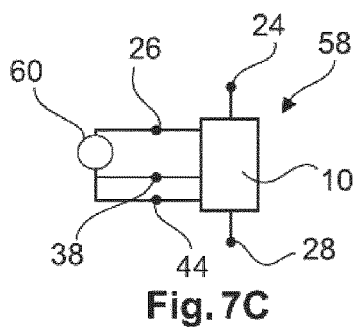

In FIG. 7C, the gate driver 60 is connected directly to the first auxiliary emitter terminal 36 and directly to the second auxiliary emitter terminal 44.

In FIG. 7D, the gate driver 60 is connected to the first auxiliary emitter terminal 36 via an auxiliary resistor 62 and directly to the second auxiliary emitter terminal 44.

FIG. 7E shows the variant with slowest switching. The gate driver 60 is connected only to the second auxiliary terminal 44.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

LIST OF REFERENCE SYMBOLS 10 semiconductor module
12 semiconductor chip
14 semiconductor switch
16 freewheeling diode
18 collector
20 gate
22 emitter
24 collector terminal
26 gate terminal
28 emitter terminal
30, 30a, 30b, 30c emitter conductor path
32, 32a, 32b, 32c emitter inductance
34 first conductor path
36 second conductor path
38 auxiliary emitter terminal
40 bridging point
42 bond wire
44 second auxiliary emitter terminal
46 third conductor path
48, 50, 52 connection point
54 auxiliary inductance
56 housing
58 semiconductor assembly
60 gate drive
62 auxiliary resistor

The invention claimed is:

1. A semiconductor module, comprising:
   at least one semiconductor chip comprising at least one semiconductor switch having a collector, emitter and gate;
   a collector terminal connected to the collector;
   a gate terminal connected to the gate;
   an emitter terminal connected to the emitter via an emitter conductor path having an emitter inductance;
   an auxiliary emitter terminal connected to the emitter;
   a second conductor path connected to the emitter having a different mutually inductive coupling with the emitter conductor path as the first conductor path;
   the first conductor path and the second conductor path are connectable to the auxiliary emitter terminal;
   wherein the semiconductor switch is an IGBT, and
   wherein each of the first conductor path and the second conductor path comprises bridging points that may be short-circuited by a bond wire for connecting the respective conductor path to the auxiliary emitter terminal.

2. The semiconductor module of claim 1, wherein the first conductor path or the second conductor path is connected to the emitter conductor path such that the first conductor path or the second conductor path and the emitter inductance have a common part.

3. The semiconductor module of claim 2, wherein the second conductor path has a mutually inductive coupling with the emitter conductor path that is at least twice as high as a mutually inductive coupling of the first conductor path with the emitter conductor path.

4. The semiconductor module of claim 2, wherein the first conductor path or second conductor path comprise an auxiliary inductance different from the emitter inductance; or
   wherein the first conductor path or second conductor is inductively coupled with the emitter inductance via an auxiliary inductance.

5. The semiconductor module of claim 2, wherein the semiconductor module comprises at least two semiconductor switches, which are connected in parallel via their emitters connected to the emitter terminal and which are connected in parallel via their gates, which are connected to the gate terminal.

6. The semiconductor module of claim 1, wherein the second conductor path has a mutually inductive coupling with the emitter conductor path that is at least twice as high as a mutually inductive coupling of the first conductor path with the emitter conductor path.

7. The semiconductor module of claim 6, wherein the first conductor path or second conductor path comprise an auxiliary inductance different from the emitter inductance; or wherein the first conductor path and/or second conductor is inductively coupled with the emitter inductance via an auxiliary inductance.

8. The semiconductor module of claim 6, wherein the semiconductor module comprises at least two semiconductor switches, which are connected in parallel via their emitters connected to the emitter terminal and which are connected in parallel via their gates, which are connected to the gate terminal.

9. The semiconductor module of claim 6, wherein the at least one semiconductor chip, the emitter conductor path, the first conductor path and the second conductor path are assembled in a common housing;
wherein the collector terminal, the gate terminal, the emitter terminal and the auxiliary emitter terminal are provided on the common housing.

10. The semiconductor module of claim 1, wherein the first conductor path or second conductor path comprise an auxiliary inductance different from the emitter inductance; or
wherein the first conductor path and/or second conductor is inductively coupled with the emitter inductance via an auxiliary inductance.

11. The semiconductor module of claim 10, wherein the semiconductor module comprises at least two semiconductor switches, which are connected in parallel via their emitters connected to the emitter terminal and which are connected in parallel via their gates, which are connected to the gate terminal.

12. The semiconductor module of claim 10, wherein the at least one semiconductor chip, the emitter conductor path, the first conductor path and the second conductor path are assembled in a common housing;
wherein the collector terminal, the gate terminal, the emitter terminal and the auxiliary emitter terminal are provided on the common housing.

13. The semiconductor module of claim 1, wherein the semiconductor module comprises at least two semiconductor switches, which are connected in parallel via their emitters connected to the emitter terminal and which are connected in parallel via their gates, which are connected to the gate terminal.

14. The semiconductor module of claim 13, wherein a first semiconductor switch is connected via a first emitter conductor path having a first emitter inductance with the emitter terminal and a second semiconductor switch is connected via a second emitter conductor path having a second emitter inductance with the emitter terminal;
wherein at least one of the first conductor path and the second conductor path comprises bridging points that may be short-circuited by a bond wire for interconnecting the first emitter conductor path and the second emitter conductor path.

15. The semiconductor module of claim 14, wherein the at least one semiconductor chip, the emitter conductor path, the first conductor path and the second conductor path are assembled in a common housing;
wherein the collector terminal, the gate terminal, the emitter terminal and the auxiliary emitter terminal are provided on the common housing.

16. The semiconductor module of claim 13, wherein the at least two semiconductor switches are connected with their emitters via a common emitter conductor path to the emitter terminal, the emitter conductor path having a common emitter inductance.

17. The semiconductor module of claim 16, wherein the at least one semiconductor chip, the emitter conductor path, the first conductor path and the second conductor path are assembled in a common housing;
wherein the collector terminal, the gate terminal, the emitter terminal and the auxiliary emitter terminal are provided on the common housing.

18. The semiconductor module of claim 13, wherein the at least one semiconductor chip, the emitter conductor path, the first conductor path and the second conductor path are assembled in a common housing;
wherein the collector terminal, the gate terminal, the emitter terminal and the auxiliary emitter terminal are provided on the common housing.

19. The semiconductor module of claim 1, wherein the at least one semiconductor chip, the emitter conductor path, the first conductor path and the second conductor path are assembled in a common housing;
wherein the collector terminal, the gate terminal, the emitter terminal and the auxiliary emitter terminal are provided on the common housing.

20. A semiconductor assembly, comprising:
a semiconductor module, comprising:
at least one semiconductor chip comprising at least one semiconductor switch having a collector, emitter and gate;
a collector terminal connected to the collector;
a gate terminal connected to the gate;
an emitter terminal connected to the emitter via an emitter conductor path having an emitter inductance;
an auxiliary emitter terminal connected to the emitter;
a first conductor path connected to the emitter having a mutually inductive coupling with the emitter conductor path;
a second conductor path connected to the emitter having a different mutually inductive coupling with the emitter conductor path than the first conductor path;
the first conductor path and the second conductor path are connectable to the auxiliary emitter terminal;
wherein the semiconductor switch is an IGBT, and
wherein each of the first conductor path and the second conductor path comprises bridging points that may be short-circuited by a bond wire for connecting the respective conductor path to the auxiliary emitter terminal,
a gate drive interconnecting the gate terminal and the emitter via at least one of:
the first conductor path;
the first conductor path and a first auxiliary resistor;
the second conductor path; and
the second conductor path and a second auxiliary resistor.

* * * * *